United States Patent [19]

Jang et al.

[11] Patent Number: 6,100,119
[45] Date of Patent: Aug. 8, 2000

[54] THIN FILM TRANSISTOR AND METHOD FOR FABRICATING THE SAME

[75] Inventors: Jin Jang; Kyung-Ha Lee, both of Seoul; You-Chan Chung, Kyoungsangbuk-do, all of Rep. of Korea

[73] Assignee: LG Electronics Inc., Seoul, Rep. of Korea

[21] Appl. No.: 09/057,538

[22] Filed: Apr. 9, 1998

Related U.S. Application Data

[62] Division of application No. 08/697,839, Aug. 30, 1996, Pat. No. 5,783,852.

[30] Foreign Application Priority Data

Aug. 31, 1995 [KR] Rep. of Korea .................. 95-28152

[51] Int. Cl.$^7$ .................... H01L 21/336; H01L 21/84
[52] U.S. Cl. .................... 438/151; 438/287; 438/517; 438/586
[58] Field of Search .................. 438/142, 165, 438/153, 149, 151, 287, 517, 586

[56] References Cited

U.S. PATENT DOCUMENTS

| | | | |
|---|---|---|---|
| 5,289,030 | 2/1994 | Yamazaki | 257/410 |
| 5,468,987 | 11/1995 | Yamazaki | 257/412 |
| 5,892,244 | 4/1999 | Tanaka et al. | 257/40 |
| 5,897,328 | 4/1999 | Yamauchi et al. | 438/29 |
| 5,904,550 | 5/1999 | Yamaguchi | 438/487 |
| 5,915,173 | 6/1999 | Kwon | 438/161 |
| 5,930,608 | 7/1999 | Yamazaki et al. | 438/166 |
| 5,949,091 | 9/1999 | Yamaguchi | 257/64 |
| 5,965,904 | 10/1999 | Ohtani et al. | 257/57 |
| 6,011,608 | 1/2000 | Tanaka | 349/153 |
| 6,013,928 | 1/2000 | Yamazaki et al. | 257/347 |

OTHER PUBLICATIONS

Kyung Ha Lee, et al., "Low Temperature Polycrystalline Silicon Thin Film Transistor with Silicon Nitride Ion Stopper", IEEE Electron Device Letters, vol. 17, No. 6, pp. 258–260, (Jun. 1996).

Primary Examiner—Mary Wilczewski
Assistant Examiner—James Park
Attorney, Agent, or Firm—Morgan, Lewis & Bockius LLP

[57] ABSTRACT

A thin film transistor includes an insulating substrate; a polysilicon pattern formed on the insulating substrate; a first nitride layer disposed on a channel portion of the polysilicon pattern; heavily doped semiconductor layer regions disposed in upper portions of the polysilicon pattern on sides of the first nitride layer pattern; an interlevel insulating layer disposed on the insulating substrate, the polysilicon pattern, the first nitride layer and the heavily doped semiconductor layer regions, the interlevel insulating layer having a contact hole to expose a portion of the heavily doped semiconductor layer; source and drain electrodes connected to the heavily doped semiconductor layer regions through the contact hole; and a gate electrode formed on the interlevel insulating layer disposed on the first nitride layer.

5 Claims, 7 Drawing Sheets

THIN FILM TRANSISTOR AND METHOD FOR FABRICATING THE SAME

This is a divisional of application Ser. No. 08/697,839 filed on Aug. 30, 1996, now U.S. Pat. No. 5,783,852.

BACKGROUND OF THE INVENTION

1. Field of the Invention

The present invention relates to a thin film transistor (TFT) and a method for fabricating the same, and more particularly, to a coplanar TFT and a method for fabricating the same.

2. Discussion of the Related Art

Generally, a polysilicon TFT is used for a pixel electrode driving element and fundamental element of the peripheral circuit in a liquid crystal display (LCD). There are several kinds of TFTs, each having a different structure. A TFT structure depends on the position of its active layer and electrode. For example, in a staggered TFT, the gate electrode and source/drain electrodes are separated from each other with an active layer of semiconductor layer in between. On the other hand, in a coplanar TFT, the gate electrode and source/drain electrodes are formed on one side of an active layer of semiconductor layer.

FIGS. 1A to 1C are cross-sectional views showing a conventional method for fabricating a coplanar TFT using an oxide layer.

As shown in FIG. 1A, a semiconductor layer pattern 11 is formed on an insulating substrate 10, and polycrystallized by laser annealing to form a first polysilicon layer pattern 12A.

As shown in FIG. 1B, an oxide layer and polysilicon layer are sequentially formed on first polysilicon layer pattern 12A, and patterned to form an oxide layer 13 and second polysilicon layer pattern 12B. Then, impurities are ion-implanted into first and second polysilicon layer patterns 12A and 12B, to form a heavily doped semiconductor layer 15. Here, the upper portion of first polysilicon layer pattern 12A forms a heavily doped semiconductor layer 15, and the whole second polysilicon layer pattern 12B forms a heavily doped semiconductor layer 15.

As shown in FIG. 1C, an interlevel insulating layer 18 of either oxide or nitride is formed on the overall surface of the substrate, and selectively removed to form a contact hole exposing heavily doped semiconductor layer 15 disposed on first polysilicon layer pattern 12A. Then, source/drain electrodes 17 are formed in contact with heavily doped semiconductor layer 15 through the contact hole. Here, oxide layer 13 serves as a gate insulating layer, and heavily doped semiconductor layer 15 formed thereon serves as a gate electrode.

In the aforementioned conventional method, since the oxide layer, which is formed on the polysilicon layer pattern at a high temperature of more than 550° C., is used for the gate insulating layer. Furthermore, the conventional method requires heat treatment at a high temperature of more than 600° C. in order to reduce the resistance of the heavily doped semiconductor layer. These processes do not allow the use of glass substrate, such as a large Corning 7069.

FIGS. 2A and 2B are cross-sectional views showing another conventional method for fabricating a TFT.

As shown in FIG. 2A, a polysilicon pattern 12A is formed on an insulating substrate 10, and an oxide layer pattern 13 is formed at a temperature below 300° C. using chemical vapor deposition (CVD) on a portion of polysilicon layer pattern 12A that will be a channel. Then, a heavily doped semiconductor layer 15 is formed on the upper portion of polysilicon layer pattern 12A formed on both sides of oxide layer pattern 13. Here, a heat treatment for forming the heavily doped semiconductor layer is carried out at a temperature below 300° C.

As shown in FIG. 2B, an interlevel insulating layer 18, for example an oxide layer, is formed on the overall surface of the substrate at a high temperature of over 400° C. and selectively removed to form a contact hole, thereby exposing a portion of heavily doped semiconductor layer 15. Then, source/drain electrodes 17 are formed in contact with heavily doped semiconductor layer 15 through the contact hole. Thereafter, a gate electrode 16 is formed of metal on a portion of interlevel insulating layer 18 placed on oxide layer pattern 13.

SUMMARY OF THE INVENTION

Accordingly, the present invention is directed to a thin film transistor and method for fabricating the same that substantially obviates one or more of the problems due to limitations and disadvantages of the related art.

It is an object of the present invention to provide a TFT in which a nitride layer is used as a gate insulating layer to reduce the interface defect density between the gate insulating layer and a polysilicon layer, thereby improving carrier mobility and reliability of the device.

A further object of the present invention is to provide a method for fabricating a TFT, in which a nitride layer is used as a mask in ion implantation for forming a heavily doped semiconductor layer, thereby improving the reliability of the device operation.

Another object of the present invention is to provide a method for fabricating a TFT, in which a heavily doped semiconductor layer is formed through ion doping to reduce source/drain contact resistance and to decrease the leakage current in the off state which is caused by hole current.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described a thin film transistor includes a substrate; a polysilicon pattern having a channel portion on the substrate; a first nitride layer on the polysilicon pattern corresponding to the channel portion; heavily doped semiconductor layer regions at upper portions of the polysilicon pattern at sides of the first nitride layer; an insulating layer on the substrate, the polysilicon pattern, the first nitride layer, and the heavily doped semiconductor layer regions, the insulating layer having a contact hole exposing a portion of each of the heavily doped semiconductor layer regions; source and drain electrodes connected to the heavily doped semiconductor layer regions through the contact hole; and a gate electrode on the insulating layer over the first nitride layer.

In another aspect, the present invention provides a method for fabricating a thin film transistor on an insulating substrate including the steps of forming a polysilicon layer having a channel portion on the substrate; forming a first nitride layer on the polysilicon layer corresponding to the channel portion; forming heavily doped semiconductor layer regions in the polysilicon layer at sides of the first nitride layer; forming an insulating layer on the substrate, the polysilicon layer, the first nitride layer, and the heavily doped semiconductor layer regions; forming a contact hole through the interlevel insulating layer to expose a portion of each of the heavily doped semiconductor layer regions; forming a conductive layer on an overall surface of the substrate; and selectively removing the conductive layer to simultaneously form a gate electrode and source and drain electrodes, the source and drain electrodes being connected to the heavily doped semiconductor layer through the contact hole.

In another aspect, the present invention provides a thin film transistor including a polysilicon pattern formed on an insulating substrate; a first nitride layer pattern formed on a portion of the polysilicon pattern, the portion being a channel, the first nitride layer pattern serving as a mask for ion doping; a heavily doped semiconductor layer formed on the upper portion of the polysilicon pattern placed on both sides of the first nitride layer pattern; a second nitride layer serving as an interlevel insulating layer formed on the overall surface of the substrate; a contact hole formed in a portion of the second nitride layer to expose the heavily doped semiconductor layer; source and drain electrodes connected to the heavily doped semiconductor layer through the contact hole; and a gate electrode formed on the second nitride layer placed on the first nitride layer pattern.

In a further aspect, the present invention provides a method for fabricating a thin film transistor including the steps of forming a polysilicon layer on an insulating substrate; forming a first nitride layer pattern on a portion of the polysilicon layer, the portion being channel; forming a heavily doped semiconductor layer on the surface of the polysilicon layer placed on both sides of the first nitride layer pattern; forming a second nitride layer on the overall surface of the substrate, the second nitride layer having a contact hole on the heavily doped semiconductor layer; and forming a metal layer on the overall surface of the substrate, and selectively removing the metal layer, to simultaneously form a gate electrode, source and drain electrodes, the source and drain electrodes being connected to the heavily doped semiconductor layer through the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
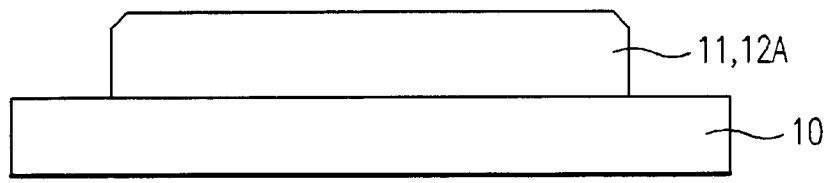
FIGS. 1A to 1C are cross-sectional views of a conventional method for fabricating a TFT.
Figure 1B:
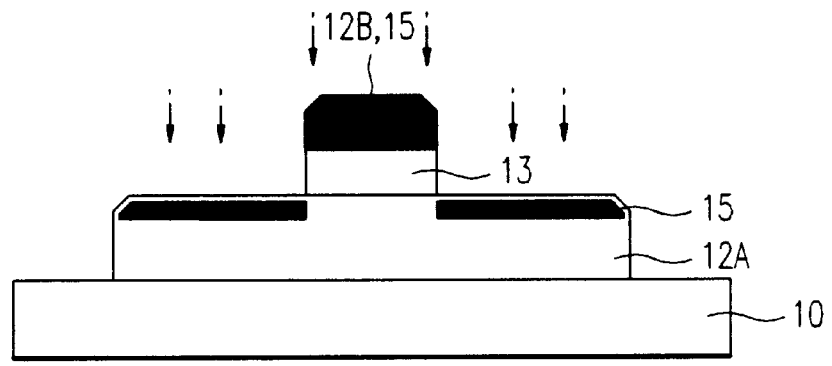
Figure 1C:
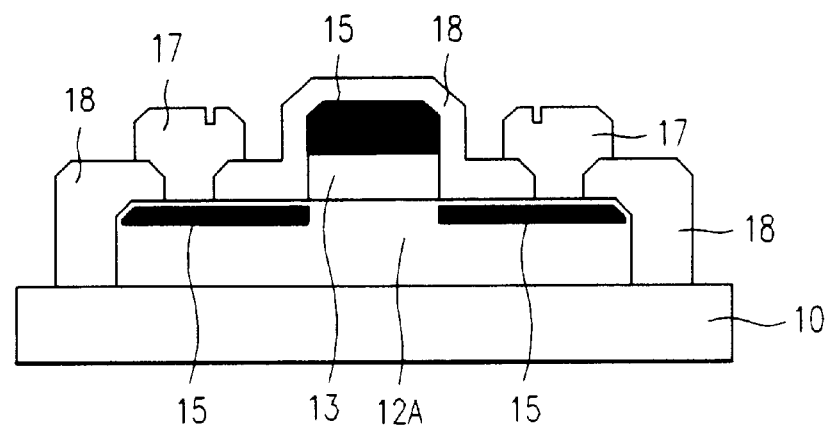
Figure 2A:
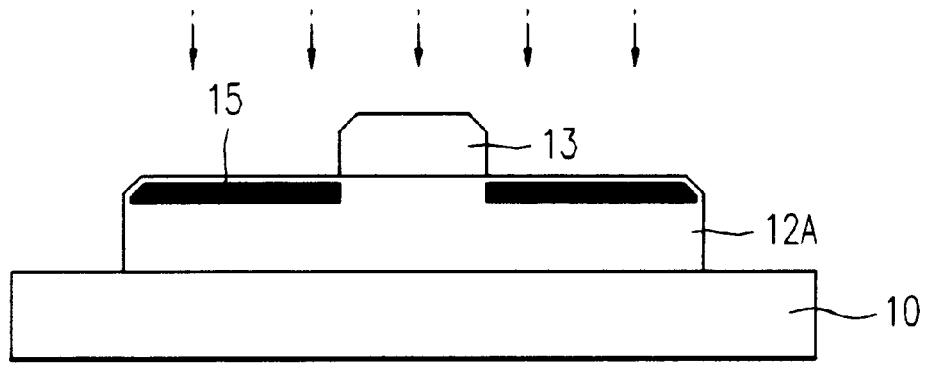
FIGS. 2A and 2B are cross-sectional views of another conventional method for fabricating a TFT.
Figure 2B:
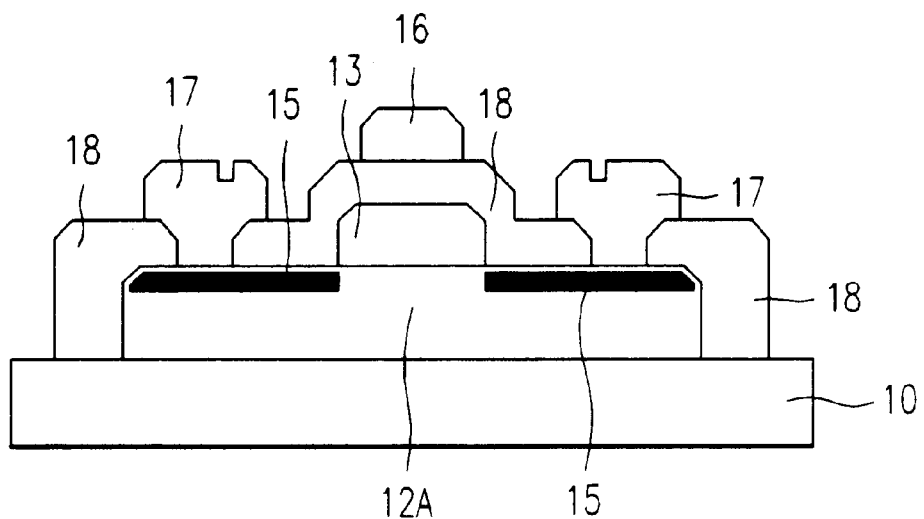
Figure 3:
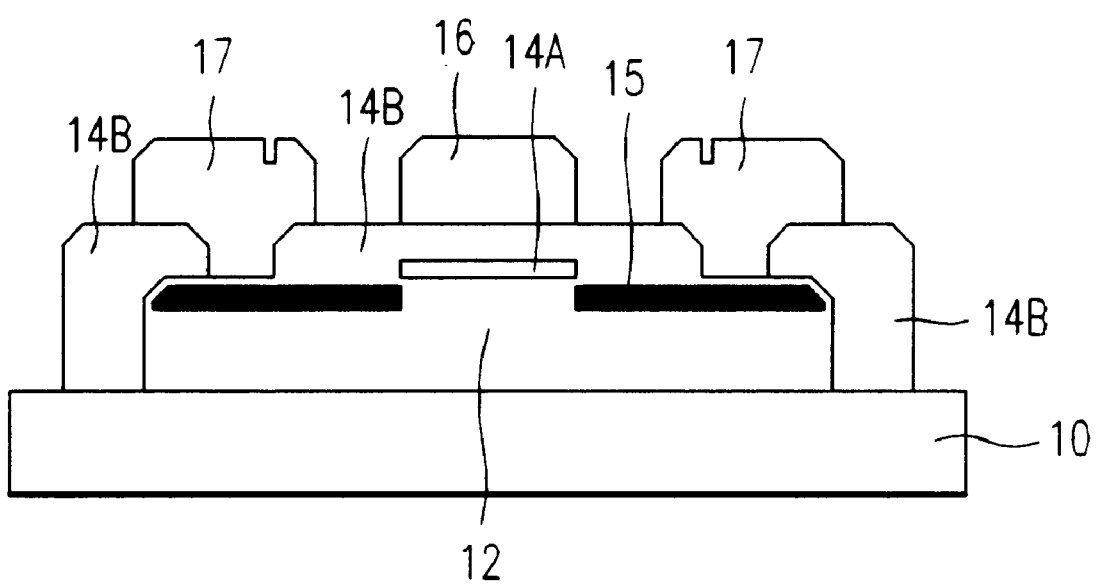
FIG. 3 is a cross-sectional view of a TFT according to the present invention.

Preferred embodiments of the present invention will be explained below with reference to the accompanying drawings. FIG. 3 is a cross-sectional view of a polysilicon TFT using a nitride layer as its gate insulating layer according to the present invention. In the polysilicon TFT of the present invention, a polysilicon layer 12 is formed on an insulating substrate 10 formed of quartz or glass, and a first nitride layer 14A serving as an ion stopper is formed on polysilicon layer 12 through plasma enhanced chemical vapor deposition (PECVD). Polysilicon layer 12 is formed such that an amorphous silicon layer is formed and then laser-annealed. First nitride layer 14A is selectively etched to form a first nitride layer pattern 14A on a channel region corresponding to a portion of polysilicon layer 12, and a heavily doped semiconductor layer 15 is formed on a portion of polysilicon layer 12 placed on both sides of nitride layer pattern 14A through ion doping.

Heavily doped semiconductor layer 15 having a low resistance is used for a source/drain contact layer, and its resistance can be reduced through hydrogenation after the ion doping. A metal layer is formed on the overall surface of substrate 10 and patterned, thereby simultaneously forming a gate electrode 16 and source/drain electrodes 17. Accordingly, the channel regions of the source/drain and gate are formed on one side of polysilicon layer 12 serving as an active layer. Thus, the resistance between the channel, and gate and source/drain is reduced during operation of the TFT.

Gate electrode 16 and source/drain electrodes 17 are preferably formed of an identical metal such as Cr or Al. Since heavily doped semiconductor layer 15 is formed under the source/drain electrodes, the series resistance of the source/drain regions is decreased.

Since the nitride layer serving as the interlevel insulating layer is formed through PECVD after ion doping for forming the heavily doped semiconductor layer, the fabrication process of the TFT is simplified, and the interface characteristics of the polysilicon layer and nitride layer are improved. As a result, it is possible to fabricate a TFT having a high carrier mobility and good operational characteristics.

Figure 4A:
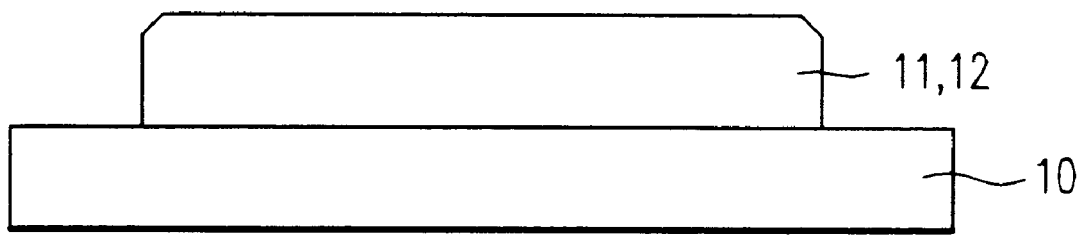
FIGS. 4A to 4D are cross-sectional views of a method for fabricating a TFT according to the present invention.

FIGS. 4A to 4D are cross-sectional views showing a method for fabricating a TFT according to the present invention. As shown in FIG. 4A, an amorphous silicon layer 11 is formed on an insulating substrate 10 through CVD, and laser-annealed to form a polysilicon pattern 12. The amorphous silicon layer 11 formed through CVD contains a very small amount of hydrogen. Accordingly, the polysilicon layer 12 of high quality is formed without dehydrogenation after laser annealing of the amorphous silicon layer 11.

Figure 4B:
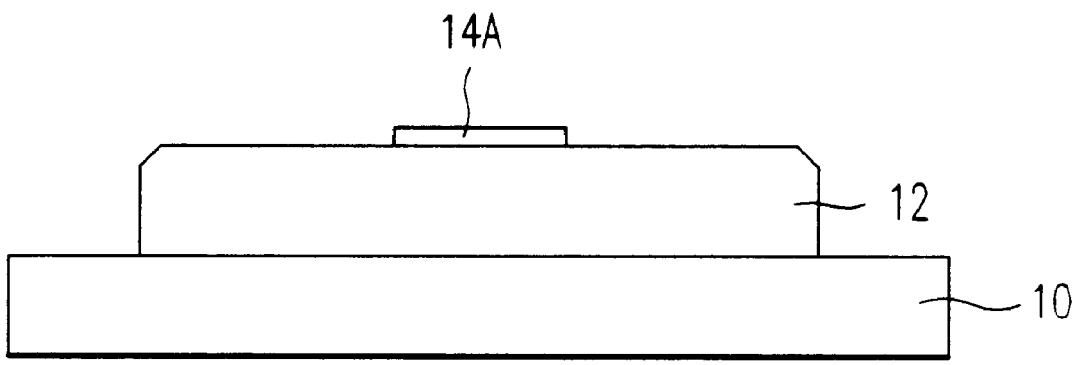
Figure 4C:
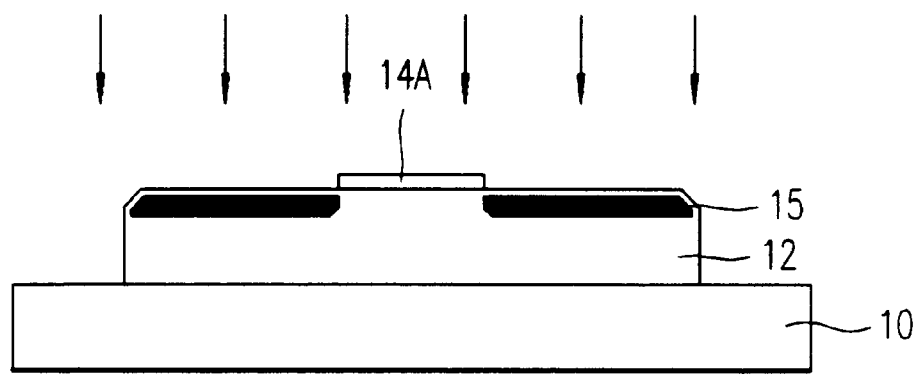

As shown in FIG. 4B, a first nitride layer 14A is formed on polysilicon layer pattern 12 through PECVD, and patterned to form a first nitride layer pattern. Here, in order to reduce the interface density between polysilicon layer 12 and first nitride layer 14A, surface-treatment is carried out on polysilicon layer 12 using hydrogen and nitrogen gases, before forming first nitride layer 14A. As shown in FIG. 4C, ion-doping is carried out to form a heavily doped semiconductor layer 15 on the upper portion of both sides of polysilicon layer pattern 12.

Figure 4D:
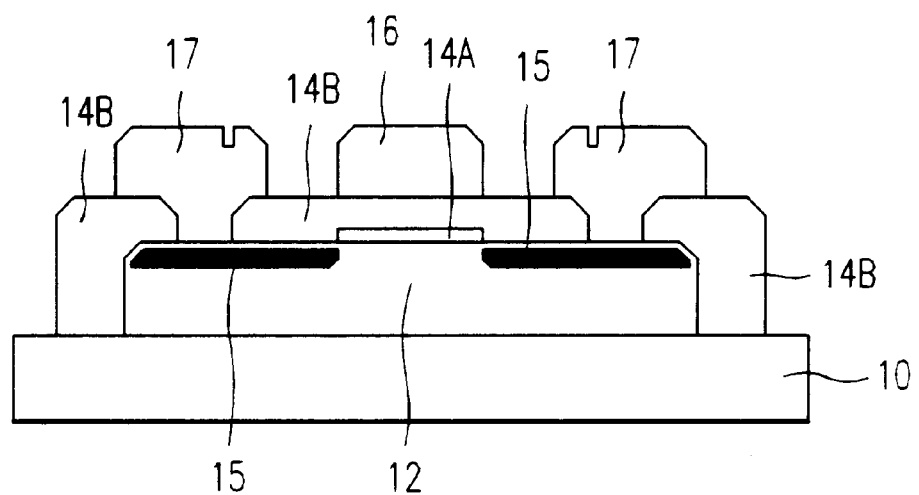

As shown in FIG. 4D, an interlevel insulating layer, for example, second nitride layer 14B is formed on the overall surface of the substrate 10, and selectively etched to form a contact hole, thereby exposing heavily doped semiconductor layer 15. Then, a metal, such as Cr or Al, is deposited on second nitride layer 14B including the contact hole, and patterned to form a gate electrode 16 and source/drain electrodes 17.

Figure 5:
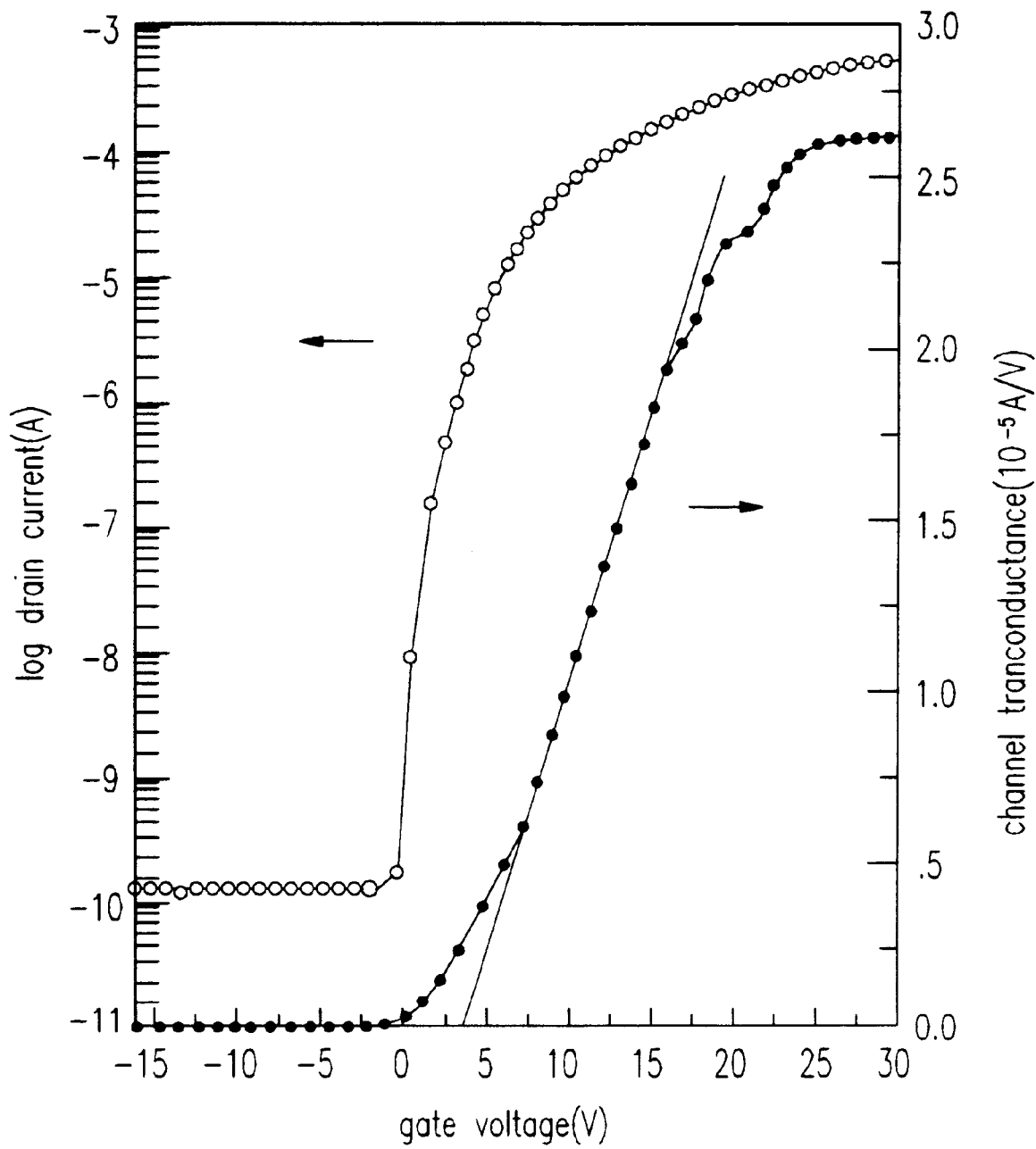
FIG. 5 is a graph illustrating the relationships between the voltage versus current, and channel transconductance versus gate voltage of a TFT according to the present invention.

FIG. 5 is a graph illustrating the relationship between the voltage versus current, and channel transconductance versus gate voltage of a TFT according to the present invention. As shown in FIG. 5, the TFT of the present invention has a quasi-threshold voltage slope (gate voltage ratio required to increase the drain current over ten times) lower than that of a conventional polysilicon TFT formed using an oxide layer which is formed through LPCVD, thermal oxidation or CVD. For example, the conventional TFT has a quasi-threshold voltage slope over 0.5 V/dec., but the TFT of the present invention has a quasi-threshold voltage slope below 0.5 V/dec. In the TFT of the present invention, the electron mobility and threshold voltage obtained in a linear region of the channel transconductance-voltage are 114 cm$^2$/Vs and 4V, respectively. Here, the width and length of the channel are 60 $\mu$m and 10 $\mu$m, respectively. Especially, when the offset length of the channel is, for example, 0 $\mu$m, leakage current at the off state is about $10^{-10}$A. This is similar to a conventional TFT having offset. Also, the quasi-threshold-voltage characteristics calculated in a region below a threshold voltage are superior to the characteristics of the aforementioned conventional TFTs.

Since the present invention uses the nitride layer as a gate insulating layer, a wide range of LCD can be fabricated through PECVD. Also, it is possible to reduce the defect density at the channel by inducing self-hydrogenation by annealing at a temperature of 230° C. In the present invention, since the interlevel insulating layer and gate insulating layer are formed of a nitride layer, TFT can be fabricated at a temperature below 300° C., unlike the conventional TFT in which the interlevel insulating layer is formed of an oxide layer. As a result, TFT having excellent operational characteristics is fabricated by a simplified process.

Figure 6:
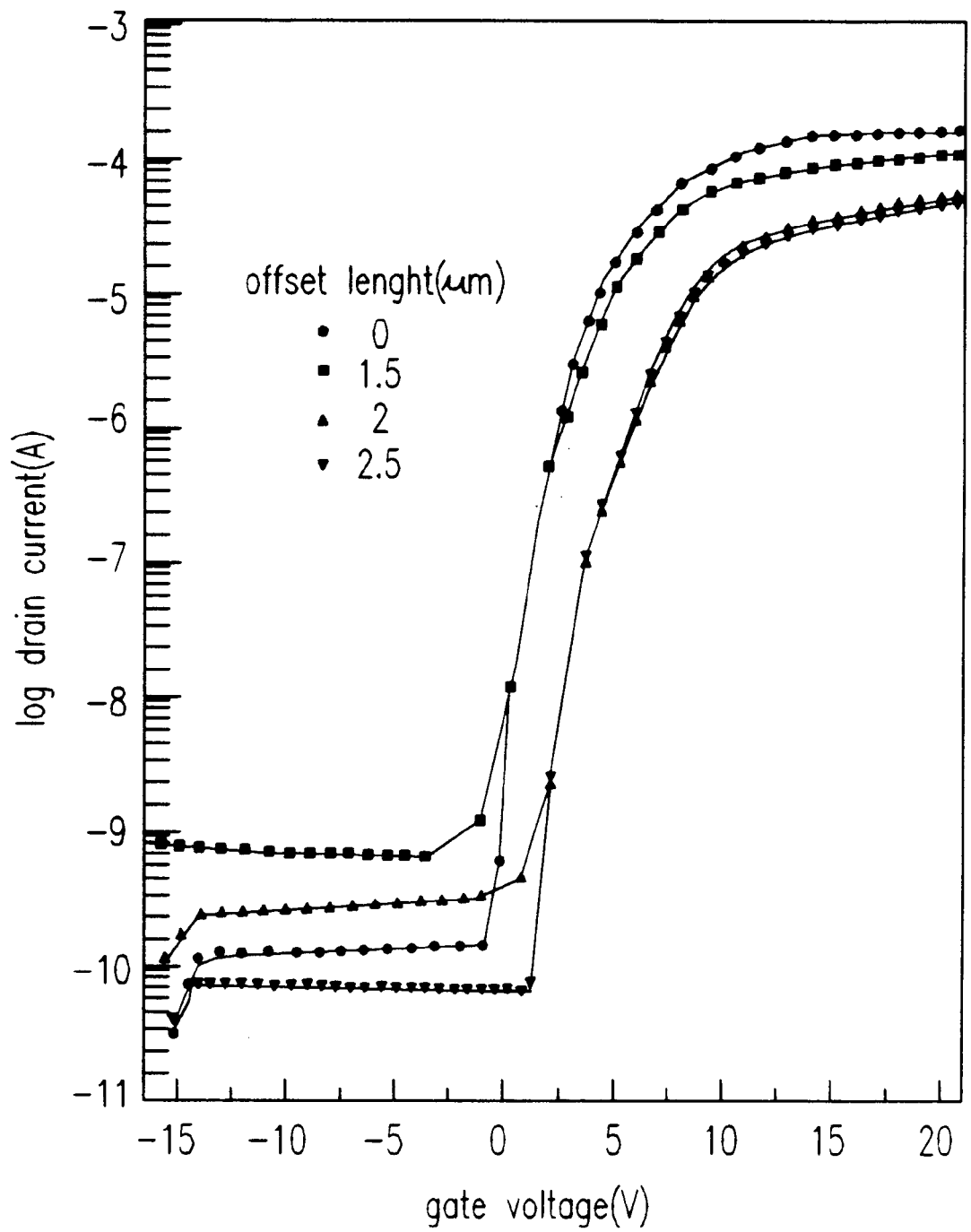
FIG. 6 is a graph illustrating the relationship between the current versus voltage for the offset length of a TFT according to the present invention.

FIG. 6 is a graph illustrating the relationship between the current versus voltage for the offset length of a TFT according to the present invention. The optimum characteristic appears when the offset length is about 0 $\mu$m. The leakage current at the off state is about $10^{-10}$A. This is lower than $10^{-9}$ A obtained for a conventional TFT.

As described above, in the method for fabricating a TFT of the present invention, the first nitride layer pattern serving as an ion stopper is formed on the polysilicon pattern, and ion doping is carried out to form the heavily doped semiconductor layer. The second nitride layer serving as the interlevel insulating layer is formed on the overall surface of the substrate, the source/drain contact hole is formed in the second nitride layer, and the gate electrode and source/drain electrodes are formed of an identical metal, thereby completing the TFT. Accordingly, the gate insulating layer (first nitride layer pattern) can be formed at a low temperature, preventing defects from being generated at the interface between the gate insulating layer and channel. Also, during ion implantation, to form the heavily doped semiconductor layer, since the first nitride layer pattern serves as the ion stopper, positive ions are prevented from accumulating in the ion stopper. This improves the characteristics of the gate insulating layer. As a result, the reliability in the TFT operation is increased. The nitride layer used for the gate insulating layer reduces the interface defect density between the gate insulating layer and a polysilicon layer, thereby decreasing leakage current while increasing carrier mobility.

Thus, in the method for fabricating a TFT according to the present invention, after the nitride layer is formed on the polysilicon layer of high quality by laser annealing and ion doping is carried out using the nitride layer as an ion stopper, a heavily doped semiconductor layer is formed without a separate activation process of the doped impurities. Accordingly, when a metal is deposited for forming source and drain electrodes, a good ohmic contact layer is formed. Moreover, the method for fabricating a TFT of the present invention provides a simplified process to obtain LCDs with uniformity and wide range. In order to increase the carrier mobility of the TFT while reducing leakage current density, it is possible to use the heavily doped semiconductor layer having a low resistance as a source/drain contact layer to minimize the exposure of its channel region to air, and to induce self-hydrogenation through the nitride layer It will be apparent to those skilled in the art that various modifications and variations can be made in the thin film transistor and method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a thin film transistor on a substrate, the method comprising the steps of:

forming a polysilicon layer having a channel portion on the substrate;

forming a first nitride layer on the polysilicon layer corresponding to the channel portion;

forming heavily doped semiconductor layer regions in the polysilicon layer at sides of the first nitride layer;

forming an insulating layer on the substrate, the polysilicon layer, the first nitride layer, and the heavily doped semiconductor layer regions;

forming a contact hole through the insulating layer to expose a portion of each of the heavily doped semiconductor layer regions;

forming a conductive layer on an overall surface of the substrate; and selectively removing the conductive layer to simultaneously form a gate electrode and source and drain electrodes, the source and drain electrodes being connected to the heavily doped semiconductor layer through the contact hole.

2. The method according to claim 1, wherein the step of forming an insulating layer includes the step of forming a second nitride layer.

3. The method according to claim 1, wherein the step of forming the heavily doped semiconductor layer regions includes the step of ion doping into the polysilicon pattern using the insulating layer as a mask.

4. The method according to claim 1, wherein the step of forming the first nitride layer includes the step of forming a silicon nitride layer through plasma enhanced chemical vapor deposition.

5. The method according to claim 1, further comprising the step of reducing an interface defect density between the polysilicon layer and the first nitride layer.

* * * * *